United States Patent
Blyth et al.

(10) Patent No.: US 6,693,828 B1
(45) Date of Patent: Feb. 17, 2004

(54) METHOD FOR COMPENSATING FIELD-INDUCED RETENTION LOSS IN NON-VOLATILE STORAGE WITH REFERENCE CELLS

(75) Inventors: Trevor A. Blyth, Sandy, UT (US); Richard V. Orlando, Los Gatos, CA (US)

(73) Assignee: Alta Analog, Inc., Los Gatos, CA (US)

( * ) Notice: Subject to any disclaimer, the term of this patent is extended or adjusted under 35 U.S.C. 154(b) by 0 days.

(21) Appl. No.: 10/418,909

(22) Filed: Apr. 17, 2003

Related U.S. Application Data

(60) Provisional application No. 60/374,842, filed on Apr. 23, 2002, and provisional application No. 60/374,843, filed on Apr. 23, 2002.

(51) Int. Cl.$^7$ ............................................. G11C 16/06
(52) U.S. Cl. ............................... 365/185.2; 365/185.22; 365/211
(58) Field of Search ................... 365/185.03, 185.11, 365/185.2, 185.22, 211

(56) References Cited

U.S. PATENT DOCUMENTS

| | | |
|---|---|---|
| 5,126,967 A | 6/1992 | Simko |
| 6,490,204 B2 * | 12/2002 | Bloom et al. .......... 365/185.28 |
| 6,498,752 B1 * | 12/2002 | Hsu et al. ............... 365/185.22 |
| 6,584,017 B2 * | 6/2003 | Maayan et al. ........ 365/185.22 |

* cited by examiner

Primary Examiner—Son T. Dinh
(74) Attorney, Agent, or Firm—Fernandez & Assosciates, LLP

(57) ABSTRACT

Reference voltages are disclosed for storage in addition to the analog or digital information for reconstructing the original voltage value of one or more analog or digital signals in non-volatile memory cells. The reference voltages are stored in separate memory cells and are written at the same time as the target information. The target information may be a single analog voltage, multiple analog voltages or a burst of digital data and is written during a relatively short period of time during which the ambient conditions do not change significantly. A method for reconstructing an original voltage value Va in a non-volatile memory, comprising: providing a set of reference voltages from a reference voltage generator; at time=0, storing a signal voltage Va in a cell and the set of reference voltages in a plurality of cells; at time=t, reading back the first signal voltage Va in the cell and the set of reference voltages from the plurality of cells to determine a retention differential compensation parameter and a temperature compensation parameter; and reconstructing the original voltage value of the signal voltage Va from the retention differential compensation parameter and the temperature compensation parameter.

33 Claims, 2 Drawing Sheets

$$\Delta V_a = (|\Delta V_L| + |\Delta V_H|)(V_a' - V_L')/(V_H' - V_L') + \Delta V_L$$

$$V_a = V_a' + \Delta V_a + \text{Temperature Compensation}$$

$$V_a = V_a' + [(V_L - V_L') + (V_H' - V_H)][(V_a' - V_L')/(V_H' - V_L')] + (V_L' - V_L) + 2(V_0 - V_0')$$

100

METHOD FOR COMPENSATING FIELD-INDUCED RETENTION LOSS IN NON-VOLATILE STORAGE WITH REFERENCE CELLS

CROSS REFERENCE TO RELATED APPLICATIONS

This application claims priority from U.S. Provisional Application Ser. No. 60/374,842 filed on Apr. 23, 2002.

This application claims priority from U.S. Provisional Application Ser. No. 60/374,843, filed on Apr. 23, 2002.

BACKGROUND INFORMATION

1. Field of the Invention

The invention relates generally to the field of integrated circuits, and more particularly to non-volatile memories.

2. Description of Related Art

The most desirable feature of a non-volatile memory (NVM) is the ability to store information for long periods of time. Various types of floating gate technology and many products are specified to keep information for up to 10 years or more. Thus, the ability of floating gate non-volatile memory cells to retain charge on the floating gate is of critical importance.

Charge retention losses are caused by:

a) Failures in the dielectrics surrounding the floating gate
b) Thermal excitation
c) Electron tunneling due to self induced or external electric fields
d) Hot electron effects in the channel close to the floating gate Units that have faulty dielectrics surrounding the floating gate usually exhibit early functional failures and are eliminated by testing and/or procedures to induce early or infant mortality failures. In normal use, when information stored in the memory cell is not intended to be modified, the bias conditions on the cell should avoid the creation of hot electron effects in the nearby channel at all times.

The two sources of retention loss described in the previous paragraph can be eliminated by testing and by careful design, but the remaining sources continue to be a potential problem. If precise analog information is being stored even a small amount of charge loss is important. If digital information is being stored then larger amounts of charge loss can be tolerated but, nevertheless, in a high temperature environment or after many write cycles as the device enters the wearout phase, the rate of charge loss may be significant. In either case, while steps may be taken to minimize unwanted charge loss, some loss may be inevitable and information can be lost.

Accordingly, it is desirable to design a reference method that compensates for loss of charge and improve the retention characteristics. For a given storage period, analog storage can achieve improved accuracy and digital storage can support higher temperatures and improved endurance.

SUMMARY OF THE INVENTION

The invention discloses reference voltages that are stored, in addition to the analog or digital information, for reconstructing the original voltage value of one or more analog or digital signals stored in non-volatile memory cells. The reference voltages are stored in separate memory cells and are written at the same time as the target information. The target information may be a single analog voltage, multiple analog voltages or a burst of digital data and is written during a relatively short period of time during which the ambient conditions do not change significantly.

A method for recapturing an original voltage value Va that is stored in a non-volatile memory, comprising: providing a set of reference voltages from a reference voltage generator; at time=0, storing a signal voltage Va in a cell and the set of reference voltages in a plurality of cells; at time=t, reading back the first signal voltage Va from the cell and the set of reference voltages from the plurality of cells to determine a retention differential compensation parameter and a temperature compensation parameter; and reconstructing the original voltage value of the signal voltage Va from the retention differential compensation parameter and the temperature compensation parameter.

Other structures and methods are disclosed in the detailed description below. This summary does not purport to define the invention. The invention is defined by the claims.

DETAILED DESCRIPTION OF PREFERRED EMBODIMENT

Figure 1:
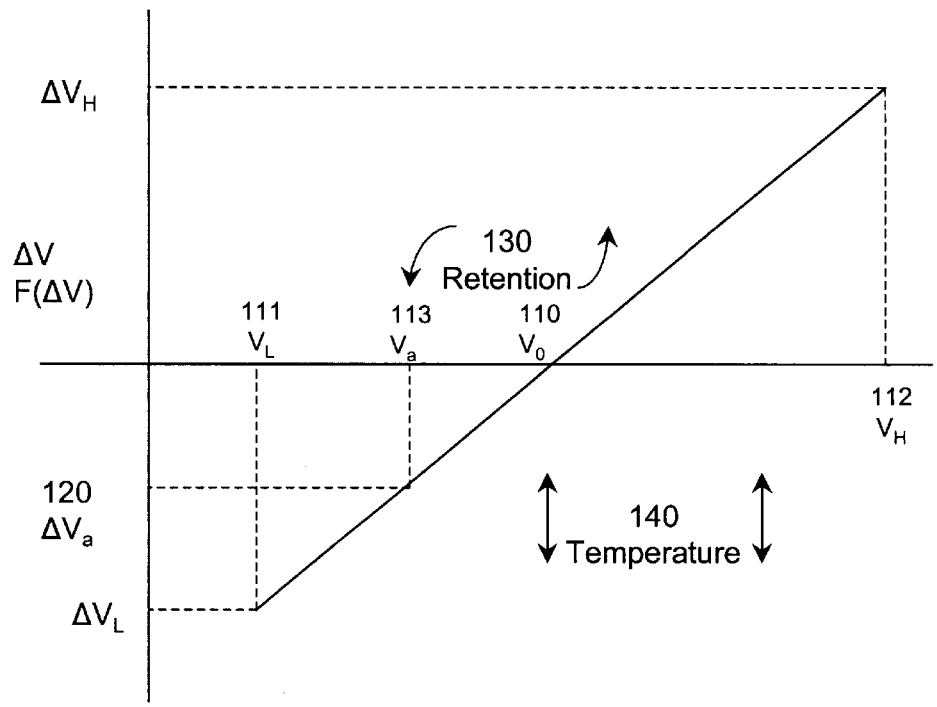
FIG. 1 is a graphical diagram illustrating the voltage loss from a floating gate versus a starting voltage in accordance with the present invention.

FIG. 1 shows a graphical diagram 100 of the voltage loss from the floating gate versus the starting voltage at time 0, with the X-axis representing a storage voltage and the Y-axis representing the change in the storage voltage. At time t=0, the curve is flat (i.e. a horizontal line coincident with the X-axis) but, as t increases and there is a loss or gain of charge on the floating gate due to retention losses, the curve departs from the horizontal. The curve rotates around $V_0(0)$ 110 due to retention effects and moves up or down (i.e. undergoes an offset) due to temperature differences (or other ambient effects such as read bias conditions) between the time of storage and the time of reading.

The change in voltage $\Delta V$ is typically a small value compared to the starting voltage. The voltage $V_0(0)$ 110 is the voltage at which there is no electric field across the oxide though which electrons tunnel. (If there are multiple oxides, $V_0(0)$ represents the voltage at which the net charge loss is zero.) The actual value of $V_0(0)$ 110 can vary depending on cell type, specific design criteria of the cell (such as capacitive coupling ratio), the voltage bias conditions applied to the cell and, to a lesser extent, on the variations in wafer processing. Voltages at each side of $V_0(0)$ 110 respond to different program levels on the cell and can be either a surplus or a deficiency of electrons. The effective voltage on the floating gate is a combination of the amount of charge stored on the gate and the voltage conditions under which the cell is biased. Retention loss over time can be either a loss or a gain of electrons depending on the direction of the electric field across the surrounding oxide(s). Voltages $V_L(0)$ 111 and $V_H(0)$ 112 are close to the minimum and maximum voltages respectively of the intended storage range.

Reference voltages $V_L(0)$, $V_0(0)$ and $V_H(0)$ are derived from an on-chip voltage reference, such as a bandgap voltage generator or a zener diode. The reference voltages typically remain stable over the time period of interest. The value of $V_0(0)$ is selected according to the cell characteristics and the conditions under which the cell is biased during the retention period. $V_a(0)$ 113 is the voltage stored at time 0. $V_L'$, $V_a'$, $V_0'$, and $V_H'$ are the voltages read from memory at time t and correspond to the voltages $V_L$, $V_a$, $V_0$ and $V_H$, stored at time 0. In the present application, the term $V_L'$ is also referred to as $V_L(t)$, $V_a'$ is also referred to as $V_a(t)$, $V_0'$ is also referred to as $V_0(t)$, $V_H'$ is also referred to as $V_H(t)$, $V_L$ is also referred to as $V_L(0)$, $V_a$ is also referred to as $V_a(0)$, $V_0$ is also referred to as $V_0(0)$, and $V_H$ is also referred to as $V_H(0)$.

Thus $V_a(0) = V_a(t) + \Delta V_a$ + Temperature Compensation where $\Delta V_a$ 120 is the change in the stored value of Va 113 due to retention loss and Temperature Compensation is the change in the stored value of Va 113 due to the difference in temperature (or other ambient effects such as read bias conditions) between is the time of storage and the time of reading.

$$\Delta V_a = (|\Delta V_L| + |\Delta V_H|) \cdot (V_a' - V_L')/(V_H' - V_L') + \Delta V_L \quad \text{Eq. 1}$$

$$V_a = V_a' + [(V_L - V_L') + (V_H' - V_H)][(V_a' - V_L')/(V_H' - V_L')] + (V_L' - V_L) + 2(V_0 - V_0') \quad \text{Eq. 2}$$

Thus the original value of Va at t=0 is derived from the stored value of Va, the stored value of the references $V_L'$, $V_H'$ and $V_0'$ and the present value of $V_L$, $V_H$ and $V_0$.

The basic principle is to make reference voltages available at all times from a reference voltage generator, such as a bandgap reference or a zener diode. These reference voltages are assumed to be constant and do not degrade over time. The reference signals are stored at the same time as the signal voltage (or multiple signal voltages). During read, the unknown loss or gain in voltage from the signal due to retention loss is deduced by measuring the loss or gain from the stored reference voltages together with the voltage differences between the signal voltage and the reference voltages. In addition, ambient effects on the memory cells are cancelled by including a term for the ambient effects on the reference voltage $V_0$ 110. It is assumed that $V_0$ 110 is not affected by retention losses and only affected by changes in temperature and other ambient conditions, such as the read bias conditions of the memory cells.

The relationships depicted in Equations 1 and 2 assume a linear loss of charge. While this may be a reasonable assumption for stored voltages that are close to $V_0$ 110, it may be necessary to utilize a logarithmic relationship for voltage differences greater than 1 or 2 volts.

For some memories, only negative voltages relative to $V_0$ 110 are stored. Other memories store voltages which are positive with respect to $V_0$ 110 and other memories is can have a combination of both, as shown in FIG. 1.

Each cell (or group of cells) used to store an input voltage or input state requires at least one additional reference storage cell to compensate for retention loss. Ambient effects can be compensated with the addition of a second reference storage cell for each target cell or group of target cells.

While the above discussion has focused on floating gate terminology, the method also applies to memories which use charge trapping in an insulator. References to "floating gate" or "gate" can be replaced with "charge traps".

Figure 2:
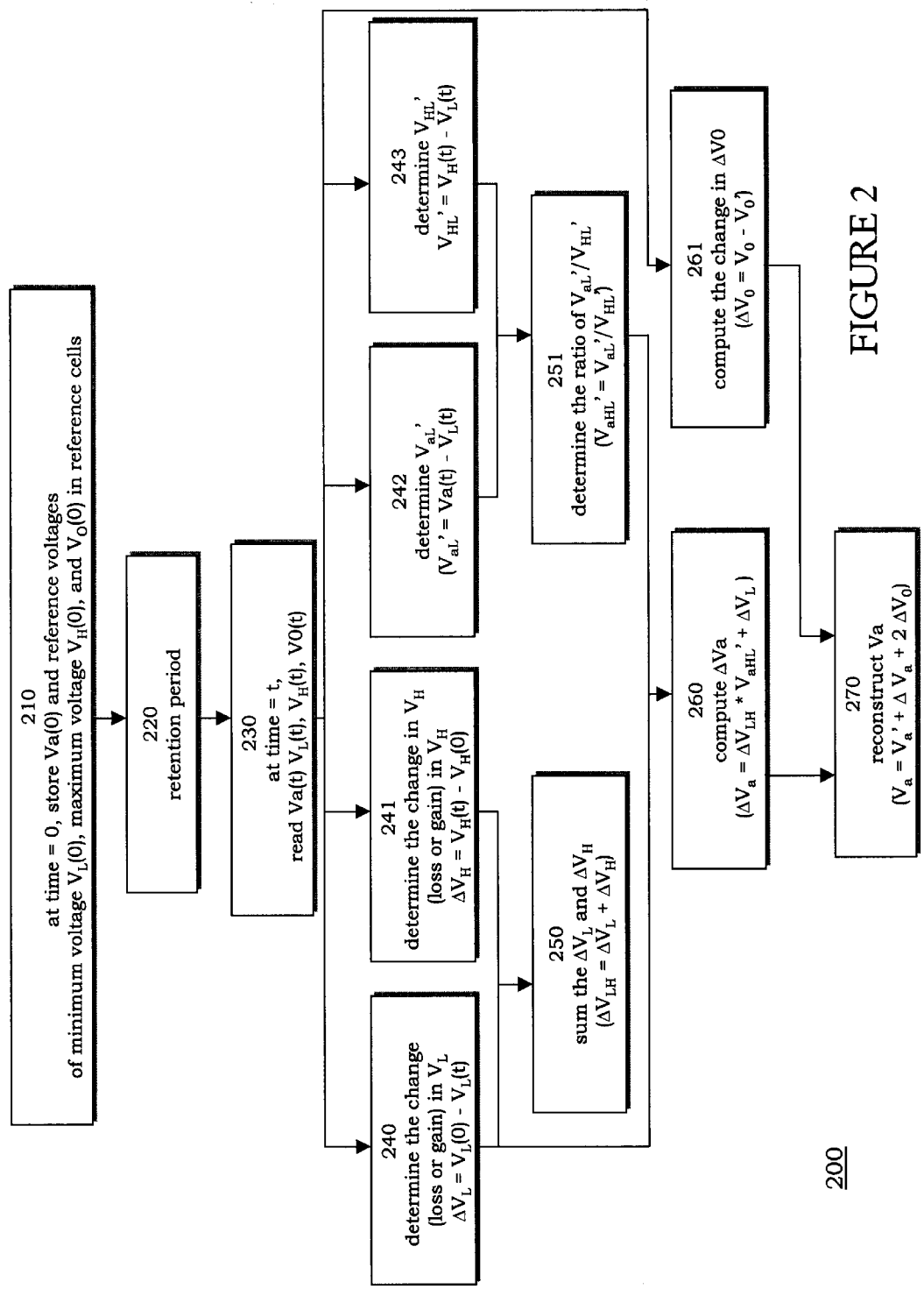
FIG. 2 is a flow diagram illustrating the process in reconstructing an original voltage value using reference cells in accordance with the present invention.

FIG. 2 is a flow diagram illustrating the process 200 in reconstructing an original voltage value using reference cells and reference voltages. At step 210, the method 200 stores the Va signal voltage 113 and the three reference cells, $V_L$ 111, $V_H$ 112, and $V_0$ 110 at time equals zero, where the three reference cells, $V_L$ 111, $V_H$ 112, and $V_0$ 110 are stored at substantially the same time as loading the contents of the Va signal voltage 113. Although a single Va voltage signal is described in FIG. 2 in recapturing the original Va voltage signal despite the retention differential in the floating gate of a non-volatile memory, one of ordinary skill in the art should recognize that the principles in the present invention are equally applicable to a series of Va voltage signals, an array of Va[1:n] voltage signals, or multiple arrays of Va[1:n] and Vb[1:n] voltage signals. Structures of one or more arrays for storing Va voltage signals are described in a co-pending application entitled "Analog Content Addressable Memory (CAM) Employing Analog Nonvolatile Storage", U.S. Provisional Application Ser. No. 60/374,843, filed on Apr. 23, 2002.

A single set of reference voltages ($V_L$, $V_H$, and $V_0$) can be shared among multiple signal voltages in the array of signal voltages Va[1:n]. Alternatively, a different set of reference voltages ($V_L$, $V_H$, and $V_0$) is associated with each signal voltage in the array of signal voltages Va[1:n]. Furthermore, a hybrid of these options is also contemplated in which a first set of reference voltages corresponding to a first group of signal voltages in the array of Va[1:n], and a second set of reference voltages corresponding to a second group of signal voltages in the array of Va[1:n]. The first group of signal voltages could be a single row or a group of rows that is associated with a particular set of reference voltages. One of ordinary skill in the art should recognize that various modifications and combinations can be practiced without departing from the spirits in the present invention.

A duration of retention period elapses, e.g. weeks, months, or years, at step 220. After the passing of the retention period denoted by time=t at step 230, the method 200 reads back the value of voltage signal Va(0) at time t denoted as Va(t), and the reference voltages of $V_L(0)$ at time t denoted as $V_L(t)$, $V_H(0)$ at time t denoted as $V_H(t)$, and $V_0(0)$ at time t denoted as $V_0(t)$.

The remaining steps describe how the reconstruction of the original value of Va is calculated arithmetically and geometrically based on the stored value of Va(t) in a first memory cell, the stored value of the reference voltage $V_L(t)$ in a second memory cell, the stored value of the reference voltage $V_H(t)$ in a third memory cell, and the stored value of the reference voltage $V_0(t)$ in a fourth memory cell, as well as the present value of $V_L$, $V_H$, and $V_0$ from a reference voltage generator. In this instance, the bandgap or zener voltage does not change from the time that the reference generator provides the reference voltages $V_L(0)$, $V_H(0)$, and $V_0(0)$ to write to the second, third, and fourth memory cells at time 0 to the time that the reference voltages $V_L(t)$, $V_H(t)$, and $V_0(t)$ are read back. In other words, the bandgap or zener voltage does not change over the retention period.

At step 240, the method 200 determines the retention differential in the minimum voltage from time=0 to time=t, represented mathematically as $\Delta V_L = V_L(0) - V_H(t)$. At step 241, the method 200 determines the retention differential of the maximum voltage from time=0 to time=t, represented mathematically as $\Delta V_H = V_H(t) - V_H(0)$. At step 242, the method 200 calculates the difference between Va(t) and $V_L(t)$, represented mathematically as $V_{aL}(t) = V_a(t) - V_L(t)$. At step 243, the method 200 calculates the difference between $V_H(t)$ and $V_L(t)$, represented mathematically as $V_{HL}(t) = V_H(t) - V_L(t)$. The operational steps 240, 242, 242, and 243 can be processed serially or in parallel relative to one another.

At step 250, the range of retention differential $\Delta V_{LH}$ is computed by summing the retention differential in the minimum voltage and the retention differential in the maximum voltage, represented mathematically as $\Delta V_{LH}=\Delta V_L+\Delta V_H$. At step 251, the measure of where the stored voltage lies on a curve in FIG. 1 (i.e., the value of Va relative to the positions of $V_H$ and $V_L$), is calculated as the ratio between $V_{aL}(t)$ and $V_{HL}(t)$, represented mathematically as $V_{aHL}(t)=V_{aL}(t)/V_{HL}(t)$.

The curve in FIG. 1 fluctuates upward or downward dependent on the change in a retention loss parameter 130 and a temperature parameter 140. To reconstruct the original voltage value of signal voltage Va 113, the method 200 compensates the retention loss parameter 130 in step 260 as denoted by ΔVa and the temperature parameter 140 in step 261 as denoted by $\Delta V_0$.

A temperature fluctuation during the elapsed retention period can impact the voltages at time 0 in storing Va(0), $V_L(0)$, $V_H(0)$, and $V_0(0)$ to at time t in reading back Va(t), $V_L(t)$, $V_H(t)$, and $V_0(t)$. The storage of an analog voltage requires a memory cell, which can be comprised of at least one transistor, such as a MOS (Metal Oxide Semiconductor) transistor. The threshold of a MOS transistor is historically sensitive to temperature fluctuation. A MOS transistor has a high temperature coefficient of, for example, 2 mv per ° C. Relatively speaking, the 2 mv per ° C. temperature sensitivity is quite significant when an analog signal is stored to an accuracy of about 1 mv. A voltage $V_0$ is stored in a reference cell to compensate for temperature effect of the stored voltages. V0 is chosen to be the voltage at which there is no net retention loss or gain from the floating gate under the bias conditions that are present during the retention period. The voltage $V_0$ changes relative to a temperature fluctuation but independent of the change in the retention loss ΔVa.

The method 200 computes 260 the retention loss ΔVa by multiplying the range of retention loss with the relative position of Va to $V_L$ and $V_H$, and adding the result to the retention differential of $V_L$, represented mathematically as $\Delta Va=\Delta V_{LH}*\Delta V_{AHL}(t)+\Delta V_L$. At step 261, the method 200 calculates the change in the voltage $\Delta V_0$, represented mathematically as $\Delta V_0=V_0(0)-V_0(t)$. The reconstruction of the original voltage value in signal voltage Va is performed in step 270 by summing the change in Va (the retention loss in Va) and the temperature compensation, denoted mathematically as $Va=V_a(t)+\Delta V_a+2V_0$, with the expanded form as shown in Equation 2. The compensation for retention loss in the signal voltage Va is represented as $\Delta V_a$, while the temperature compensation is represented as $2\Delta V_0$.

One suitable application of the present invention is in the storage of high fidelity audio in analog memories. At t=0, an analog signal Va is stored between two dynamic ranges of $V_L$ and $V_H$, which may be subjected to a retention loss over time. The reference voltages $V_L$, $V_H$, and $V_0$ stored in reference cells provide a technique to recover the original analog signal quality Va despite the retention loss and temperature effect.

The above embodiments are only illustrative of the principles of this invention and are not intended to limit the invention to the particular embodiments described. Accordingly, various modifications, adaptations, and combinations of various features of the described embodiments can be practiced without departing from the scope of the invention as set forth in the appended claims.

We claim:

1. A method for reconstructing an original voltage value Va stored in a non-volatile memory, comprising:

providing a set of reference voltages from a reference voltage generator;

at time=0, storing a signal voltage Va in a cell and the set of reference voltages in a plurality of cells;

at time=t, reading back the first signal voltage Va from the cell and the set of reference voltages from the plurality of cells to determine a retention differential compensation parameter and a temperature compensation parameter; and recapturing the original voltage value of the signal voltage Va from the retention differential compensation parameter and the temperature compensation parameter.

2. The method of claim 1, wherein the set of reference voltages comprises a minimum voltage $V_L$, a maximum voltage $V_H$, and a reference voltage $V_0$.

3. The method of claim 1, wherein the original voltage value comprise an analog signal.

4. The method of claim 1, wherein the original voltage value comprise a digital signal.

5. The method of claim 1, wherein the retention differential is a loss.

6. The method of claim 1, wherein the retention differential is a gain.

7. The method of claim 2, wherein the $V_0$ voltage represents when there is no electric field across an oxide through which electrons tunnel for a single oxide.

8. The method of claim 2, wherein the $V_0$ voltage represents the voltage at which a net charge loss is zero for multiple oxides.

9. The method of claim 1, wherein the reference voltage generator comprises a bandgap voltage generator.

10. The method of claim 1, wherein the reference voltage generator comprises a zener diode.

11. A method for reconstructing an array of original voltage values Va[1:n] in a non-volatile memory, comprising:

providing multiple sets of reference voltages from a reference voltage generator;

at time=0, storing an array of signal voltages Va[1:n], each Va in the array of signal voltages Va[1:n] being stored in a memory cell in a plurality of memory cells with a corresponding set of reference voltages from the multiple sets of reference voltages being stored in a plurality of reference memory cells;

at time=t, reading back a first Va signal voltage in the array of signal voltages Va[1:n] from a respective one in the plurality of memory cells and reading back the corresponding set of reference voltages to the first Va[1] signal voltage from the respective one in the plurality of reference memory cells to determine a first retention differential compensation parameter and a first temperature compensation parameter associated with the first Va signal voltage; and recapturing the original voltage value of the first signal voltage Va[1] from the first retention differential compensation parameter and the first temperature compensation parameter.

12. The method of claim 11, wherein at time=t, reading back a second Va[2] signal voltage in the array of signal voltages Va[1:n] from a respective one in the plurality of memory cells and reading back a corresponding set of reference voltages associated with the second Va[2] signal voltage from the respective one of the multiple sets of reference voltages to determine a second retention differential compensation parameter and a second temperature compensation parameter associated with the second Va[2] signal voltage; and recapturing the original voltage value of the second signal voltage Va[2] from the second retention differential compensation parameter and the second temperature compensation parameter.

13. The method of claim 12, wherein each set of reference voltages in the multiple sets of reference voltages comprises a minimum voltage $V_L$, a maximum voltage $V_H$, and an ambient voltage $V_0$.

14. The method of claim, 12 wherein a single set of reference voltages are shared by multiple signal voltages in the array of signal voltages Va[1:n].

15. The method of claim 11, wherein the original voltage value comprise an analog signal.

16. The method of claim 11, wherein the original voltage value comprise a digital signal.

17. The method of claim 11, wherein the first retention differential is a loss.

18. The method of claim 11, wherein the first retention differential is a gain.

19. The method of claim 13, wherein the $V_0$ voltage represents when there is no electric field across an oxide through which electrons tunnel for a single oxide.

20. The method of claim 13, wherein the $V_0$ voltage represents the voltage at which a net charge loss is zero for multiple oxides.

21. The method of claim 11, wherein the reference voltage generator comprises a bandgap voltage generator.

22. The method of claim 11, wherein the reference voltage generator comprises a zener diode.

23. A method for reconstructing an array of original voltage values Va[1:n] in a non-volatile memory, comprising:
providing a single set of reference voltages from a reference voltage generator; at time=0, storing an array of signal voltages Va[1:n], each Va in the array of signal voltages Va[1:n] being stored in a memory cell in a plurality of memory cells and the single set of reference voltages being stored in a plurality of reference memory cells;
at time=t, reading back a first Va signal voltage in the array of signal voltages Va[1:n] from a respective one in the plurality of memory cells and reading back the single set of reference voltages from the plurality of reference memory cells to determine a first retention differential compensation parameter and a first temperature compensation parameter associated with the first Va signal voltage; and
recapturing the original voltage value of the first signal voltage Va[1] from the first retention differential compensation parameter and the first temperature compensation parameter.

24. The method of claim 23, wherein at time=t, reading back a second Va[2] signal voltage in the array of signal voltages Va[1:n] from a respective one in the plurality of memory cells and reading back the single set of reference voltages associated with the second Va[2] signal voltage to determine a second retention differential compensation parameter and a second temperature compensation parameter associated with the second Va[2] signal voltage; and
recapturing the original voltage value of the second signal voltage Va[2] from the second retention differential compensation parameter and the second temperature compensation parameter.

25. The method of claim, 23 wherein the single set of reference voltages are shared among multiple signal voltages in the array of signal voltages Va[1:n].

26. A method for reconstructing an array of original voltage values Va[1:n] in a non-volatile memory, comprising:
providing a first set of reference voltages and a second set of reference voltages from a reference voltage generator;
at time=0, storing an array of signal voltages Va[1:n], a first group of signal voltages Va in the array of signal voltages Va[1:n] being associated with a first set of reference voltages, a first group of signal voltages Va in the array of signal voltages Va[1:n] being stored in memory cells at about the same time as storing of the first set of reference voltages in a plurality of reference memory cells;
at time=t, reading back one or more signal voltages from the first group of signal voltages Va in the array of signal voltages Va[1:n] and reading back the first set of reference voltages from the plurality of reference memory cells to determine a first retention differential compensation parameter and a first temperature compensation parameter; and
reconstructing an original voltage value for one or more signal voltages of the first group of signal voltages Va from the first retention differential compensation parameter and the first temperature compensation parameter.

27. The method of claim 26, further comprising:
at time=0, storing a second group of signal voltages Va in the array of signal voltages Va[1:n] being associated with a second set of reference voltages, a second group of signal voltages Va in the array of signal voltages Va[1:n] being stored in memory cells at about the same time as storing of the second set of reference voltages in a plurality of reference memory cells;
at time=t, reading back one or more signal voltages from the second group of signal voltages Va in the array of signal voltages Va[1:n] and reading back the second set of reference voltages from the plurality of reference memory cells to determine a second retention differential compensation parameter and a second temperature compensation parameter; and
reconstructing an original voltage value for one or more signal voltages of second group of signal voltages Va from the second retention differential compensation parameter and the second temperature compensation parameters.

28. The method of claim 26, wherein the first group of signal voltages Va in the array of signal voltages Va[1:n] comprises a single row.

29. The method of claim 26, wherein the first group of signal voltages Va in the array of signal voltages Va[1:n] comprises a group of rows.

30. The method of claim 26, wherein the first group of signal voltages Va in the array of signal voltages Va[1:n] is read serially.

31. The method of claim 26, wherein the first group of signal voltages Va in the array of signal voltages Va[1:n] is read in parallel.

32. A method for reconstructing an original voltage value Va in a non-volatile memory, comprising:
storing voltages at time 0, comprising:
storing a first signal voltage Va in a first memory cell;
storing a minimum reference voltage $V_L$ in a second memory cell;
storing a maximum reference voltage $V_H$ in a third memory cell;
storing a reference voltage $V_0$ in a fourth memory cell;
reading voltages at time t after a retention period, comprising:
reading the first signal voltage Va from the first memory cell;
reading the minimum reference voltage $V_L$ from the second memory cell to determine the retention loss in the minimum reference voltage $V_L$;

reading the maximum reference voltage $V_H$ from the third memory cell to determine the retention gain in the maximum reference voltage $V_H$;

reading the ambient voltage $V_O$ from the fourth memory cell to determine the temperature compensation in the voltage $V_O$;

reconstructing the original voltage value of the signal voltage Va from the retention loss in the minimum reference voltage $V_L$, the retention gain in the maximum reference voltage $V_H$, and the temperature compensation in the ambient voltage $V_O$.

33. A method for recapturing an original voltage value Va in a non-volatile memory, comprising:

$$V_a = V_a' + [(V_L - V_L') + (V_H' - V_H)] [(V_a' - V_L')/(V_H' - V_L')] + (V_L' - V_L) + 2(V_O - V_O')$$

where $V_L$ denotes the minimum voltage at time 0, $V_H$ denotes the maximum voltage at time 0, $V_O$ denotes the ambient voltage at time 0, $V_L'$ denotes the minimum voltage at time t, $V_H'$ denotes the maximum voltage at time t, $V_O'$ denotes the ambient voltage at time t.

* * * * *